United States Patent [19]

Glasbergen

[11] 4,039,950
[45] Aug. 2, 1977

[54] PULSE CODE TRANSMITTER AND RECEIVER DESIGNED TO PRODUCE UNIFORM TRANSFER CHARACTERISTICS IN THE FACE OF COMPONENT VARIATIONS

[75] Inventor: Johannes Wilhelmus Glasbergen, Hilversum, Netherlands

[73] Assignee: U.S. Philips Corporation, New York, N.Y.

[21] Appl. No.: 639,576

[22] Filed: Dec. 10, 1975

[30] Foreign Application Priority Data

Feb. 14, 1975 Netherlands .................... 7501724

[51] Int. Cl.² .............................................. H04B 1/00
[52] U.S. Cl. ................................ 325/38 B; 332/11 D
[58] Field of Search ........................... 325/38 R, 38 B; 332/11 D; 179/15 AP

[56] References Cited

U.S. PATENT DOCUMENTS

| | | | |
|---|---|---|---|
| 3,729,678 | 4/1973 | Glasbergen et al. | 325/38 B |
| 3,868,574 | 2/1975 | Ferrieu et al. | 325/38 B |

Primary Examiner—Robert L. Griffin
Assistant Examiner—Jin F. Ng
Attorney, Agent, or Firm—Frank R. Trifari; Simon L. Cohen

[57] ABSTRACT

A pulse code modulation transmission device comprising a transmitter and a receiver each being provided with a dynamic control circuit and a modulator built up of a first controlled current source circuit supplying a supply current for a difference amplifier which is controlled by output pulses from the transmitter and incorporating in its two output circuits pnp current mirror circuits whose outputs are connected to the output of a modulator directly and through a precision polarity reversing circuit, respectively. The control input of the first current source circuit is coupled to the output of the dynamic control circuit as well as to the input of a fourth current source circuit arranged in parallel therewith whose output is connected in the manner of a feedback through a pnp-current mirror circuit to a npn-current mirror circuit whose output is coupled to the output of the dynamic control circuit.

11 Claims, 2 Drawing Figures

PULSE CODE TRANSMITTER AND RECEIVER DESIGNED TO PRODUCE UNIFORM TRANSFER CHARACTERISTICS IN THE FACE OF COMPONENT VARIATIONS

BACKGROUND OF THE INVENTION

1. Field Relating to the Invention

The invention relates to an arrangement for the transmission of information signals by means of pulse code modulation said arrangement comprising a transmitter and a receiver each provided with a decoder. The transmitter is also provided with a quantizing device to which a pulse generator is connected and which supplies output pulses for transmission to the receiver. These output pulses are also applied in the transmitter through a feedback circuit to a transmitter input circuit comprising a cascade arrangement of said decoder and a comparison circuit, said information signals also being applied to this comparison circuit. The transmitter input circuit generates an output signal which is applied to said quantizing device. In this transmission arrangement both the transmitter and the receiver are provided with a dynamic control device to which output pulses from the quantizing device are applied and which supplies a dynamic control signal at its output. The transmitter and the receiver futhermore each comprise a modulator whose output is coupled to an input of the relevant decoder. Furthermore, this modulator has an input which is connected to the output of the relevant dynamic control device, and a controlled first current souce circuit whose control input is coupled to said input of the modulator and which supplies an output current as a supply current to a difference amplifier having a first and a second output circuit, which difference amplifier is controlled by output pulses from the quantizing device. The said first and second output circuits of the difference amplifier are connected to an input of current-controlled second and third current source circuits, the output of the second current source circuit being connected directly and the output of the third current source being connected through a precision polarity reversing circuit, to the output of the modulator.

In this connection pulse code modulation is not only understood to mean the transmission of information signals by means of multi-bit code words in the manner as is effected in PCM-coding and transmission, but is also understood to mean the differential coding forms DPCM, delta modulation and delta sigma modulation.

2. Description of the Prior Art

An arrangement of the kind mentioned above is described in U.S. Pat. No. 3,868,574. As described in the said patent application the modulator supplies a positive and a negataive output current. These output currents are utilized for decoding the output pulses supplied by the quantizing device and this modulator supplies a positive output current if the quantizing device supplies an outputppulse having for example the logical value 1 and it supplies a negative output current if the quantizing device supplies an output pulse having the complimentary logical value, that is to say, the logical value 0. The absolute value of an output current of the modulators is dependent on the value of its input current, or in other words it is dependent on the value of the output current of the associated dyanmic control circuit.

In the arrangement described in said U.S. Patent the current-controlled second and third current source circuts as well as the precision polarity reversing circuit are formed as so-called current mirror circuits. In connection with the requirement to be able to form the modulators as an integrated circuit (monolithic) the first current source circuit and the difference amplifier are more particularly formed with npn-transistors and consequently the current-controlled second and third current source circuits are each formed with pnp-transistors and the precision polarity reversing circuit is formed with npn-transistors.

When forming the modulator as a monolithic integrated circuit with a polarity reversing circuit built up of npn-transistors, it is achieved that the positive output current occurring at a given value of the input current of the circuit is accurately equal to the negative output current occurring at the same value of the input current.

In monolithic integrated circuits, however, the combination of pnp and npn-transistors causes troubles residing inthe fact that the pnp-transistors generally have a too low current gain factor (for example less than 10) while this current gain factor in pnp-transistors is also temperature and current-dependent and may be different from integrated circuit to integrated circuit.

Owing to these properties of the pnp-transistors incorporated in the integrated circuits, the relationship between input current and output current may vary greatly from integrated circuit to integrated circuit. As a result serious deviations of the desired linearity of the signal transmission occur which cannot be inhibited to a sufficient extent with the aid of the control members present in the transmission device.

SUMMARY OF THE INVENTION

An object of the invention is to reduce the above-mentioned deviations in linearity of the signal transmission to an admissible limit of, for example, 5% in a transmission device of the kind described in the preamble in which monolithic integrated modulators are used without using additional control members.

According to the invention the modulators of the transmitter and receiver each comprise controlled fourth and fifth current source circuits in which the control input of the fourth circuit and the ouput of the fifth current source circuit are coupled to the input of the modulator, the output of said fourth current souce circuit being connected to the control input of a current-controlled sixth current source circuit whose output is connected in the manner of a feedback to the control input of said fifth current source circuit.

By using the steps according to the invention it is achieved that the relationship between the value of the input current of the integrated circuit and the absolute value of its output current for the modulators formed as integrated circuits is accurately in conformity with a pre-determined relationship. For example, for each of these circuits the output current in absolute value is accurately equal to its input current.

SHORT DESCRIPTION OF THE DRAWINGS

FIGS. 1 and 2 show a transmitter and a receiver respectively, for delta modulation using the steps according to the invention.

DESCRIPTION OF THE PREFERRED EMBODIMENT

Figure 1:
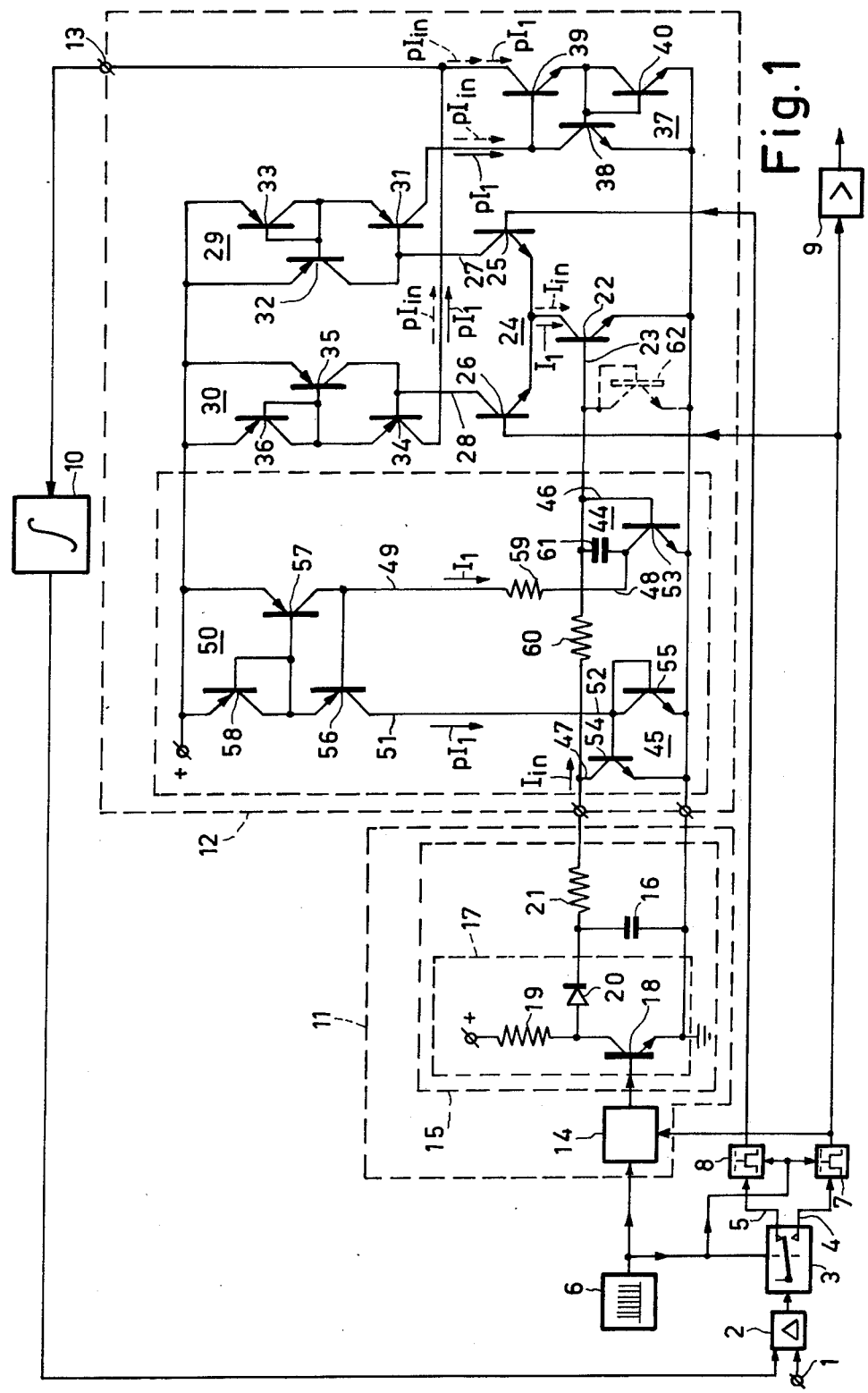

FIG. 1 shows a transmitter according to the invention. This transmitter is adapted for the transmission of continuously varying signals in the form of speech signals which are located in the frequency band of approximately 0.3–3.4 kHz. These speech signals are applied through an input terminal 1 to a comparison circuit in the form of a difference amplifier 2 the output of which is connected in this embodiment to the input of a quantizing device 3. This quantizing device 3, which in this embodiment is symbolically denoted by a switch, is provided with two outputs 4 and 5 and is controlled by a clock pulse generator 6. More particularly this quantizing device 3 supplies a pulse having a logical value of 1 to its output 4 and a pulse having a logical value 0 to its output 5 if the output signal from the difference amplifier 2 is positive at the instant of occurrenece of a clock pulse from the clock pulse generator 6. Conversely, the quantizing device 3 applies a pulse having a logical value of 0 to its output 4 and a pulse having a logical value of 1 to its output 5 if the output signal from the difference amplifier 2 is negative at the instant of occurrence of a clock pulse from the clock pulse generator 6.

To suppress the variations in amplitude, duration, shape or instant of occurrence of the output pulses supplies by the quantizing device 3, which variations are caused in the quantizing device 3, its outputs 4 and 5 are connected to pulse regenrators 7 and 8, respectively, which are likewise controlled by the clock pulse generator 6. The output pulses from the pulse regenerator 7 are transmitted through an output amplifier 9 to the receiver shown in FIG. 2.

In addition to the speech signals, a comparison signal is also applied to the difference amplifier 2, which comparison signal is derived in this embodiment from a decoder 10 formed as an integrating network. A signal which is derived from the output pulses supplies by the quantizing device 3 is applied to this decoder 10.

In the transmitter shown a dynamic control is also used which is preferably effected in the manner as described in U.S. Pat. No. 3,729,678, issued Apr. 24, 1973 and U.S. Pat. No. 3,868,574. More particularly, the transmitter shown includes a dynamic control circuit 11 to which the output pulses from the pulse regenerator 7 are applied and which supplies a dynamic control signal at its output in the form of a current continuously varying in intensity. This output current is applied to a modulator 12 whose output 13 is connected to the input of the integrating network 10.

The dynamic control circuit 11 includes a pulse pattern analyzer 14 which is built up in the manner described in said U.S. Pat. No. 3,729,678. This pulse pattern analyser 14 analyzes the pulses to be transmitted to the receiver and supplies an output pulse whenever pre-determined pulse patterns occur, which pulse patterns are formed by at least three consecutive output pulses from the pulse regenerator 7. The dynamic control circuit 11 also includes an integrating network 15 which is provided with an integrating capacitor 16 and a switched current source circuit 17 to which latter the output pulses from the pulse pattern analyzer 14 are applied as switching pulses. In the manner as described with reference to said U.S. Pat. No. 3,868,574 this current source circuit is constituted by a npn-transistor 18 whose emitter is connected to ground potential, whose base is connected to the output of the pulse pattern analyzer 14 and whose collector is connected through a collector resistor 19 to the positive terminal of a direct voltage supply source. The integrating capacitor 16 is provided between the collector and the emitter of the transistor 18 in the manner as shown in the Figure while using a diode 20. The capcitor voltage is converted by means of a resistor 21 into a current which is applies to the modulator 12.

This modulator 12 includes a controlled first current source circuit in the form of an npn-transistor 22 whose base 23, operating as the control input of the current source circuit, is coupled to the ouput of the dynamic control circuit 11 and whose emitter is connected to ground potential. This first current source circuit 22 supplies an output current which is applied as a supply current to a difference amplifier 24. This difference amplifier 24 is constituted by two npn-transistors 25 and 26 whose emitters are connected together and to the collector of the transistor 22. These transistors 25 and 26 are controlled in the embodiment shown by the output pulses from the pulse regenerators 8 and 7, respectively, for which purpose these pulse regenerators are connected to the base of the transistor 26 and to the base of the transistor 25, respectively.

Furthermore the difference amplifier 24 is provided with two output circuits 27 and 28 which are constituted by the collector circuit of transistor 25 and the collector circuit of transistor 26, respectively. The output circuit 27 incorporates a current-controlled second current source circuit 29 and the output circut 28 incorporates a current-controlled third current source circuit 30. These current-controlled second and third current source circuits 29, 30 are each formed as a so-called current mirror circuit. More particularly, the current mirror circuit 29 is constituted in known manner shown in the Figure by two pnp-transistors 31 and 32 and a pnp-transistor 33 arranged as a diode. The collector and the base of the transistors 31 and 32 are connected together and to the collector of transistor 25, while the emitters of the transistors 32 and 33 are connected to the positive terminal of a direct voltage supply source. The output of the current mirror circuit 29 is constituted by the collector of the transistor 31. The current mirror circuit 30 is built up in the same manner as the current mirror circuit 29 and likewise includes two pnp-transistors 34 and 35 and a pnp-transistor 36 arranged as a diode. Also in this circuit 30 the base and the collector of the transistors 34 and 35 are connected together and to the collector of the transistor 26 while the emitters of the transistors 35 and 36 are connected to the positive terminal of the direct voltage supply source. The output of the current mirror circuit 30 is constituted by the collector of the transistor 34.

In the embodiment shown the output of the current mirror circuit 30 is connected directly to the output terminal 13 of the modulator 12 and the output of the current mirror circuit 29 is connected to this output terminal 13 through a precision polarity reversing circuit 37 which in this embodiment is likewise constituted by a current mirror circuit which is, however, built up with transistors of the npn-type. More particularly, this current mirror circuit 37 is consituted in known manner shown in the Figure by two npn-transistors 38 and 39 and an npn-transistor 40 arranged as a diode. The collector and the base of the transistors 38 and 39 are connected together and to the output of the current mirror circuit 29, while the emitters of the transistors 38 and 40 are connected to ground potential. The output of this current mirror circuit 37 is constituted by the collector of the transistor 39 and is connected directly to the output terminal 13 of the modulator 12.

In the known arrangement described so far in which in practice the npn-transistor 62 arranged as a diode and shown in broken lines in the Figure was incorporated between the base and the collector of the transistor 22, which npn-transistor 62 likewise constituted a current mirror circuit with the transistor 22, the operation is as follows. When a current $I_{in}$ is applied by the dynamic control circuit 11 to the modulator 12, a current $I_{in}$ will likewise start to flow in the collector circuit of the transistor 22 in a direction which is denoted by the broken-line arrow in the Figure. When transistor 26 of the difference amplifier 24 is conducting and thus transistor 25 is cut off, a current $pI_{in}$ will start to flow in the collector circuit of transistor 34 at a given value p of the current gain factor of the current mirror 30, which current appears as a positive output current at the output 13 of the modulator 12 and is thus applied as a charge current to the integrating network 10. However, when the transistor 26 of the difference amplifier 24 is cut off and the transistor 25 is conducting, the current $pI_{in}$ occurs in the collector circuit of the transistor 31. This current $pI_{in}$ is converted by the current mirror circuit 37 into a current $-pI_{in}$ which as a discharge current decreases the integrator voltage.

Figure 2:
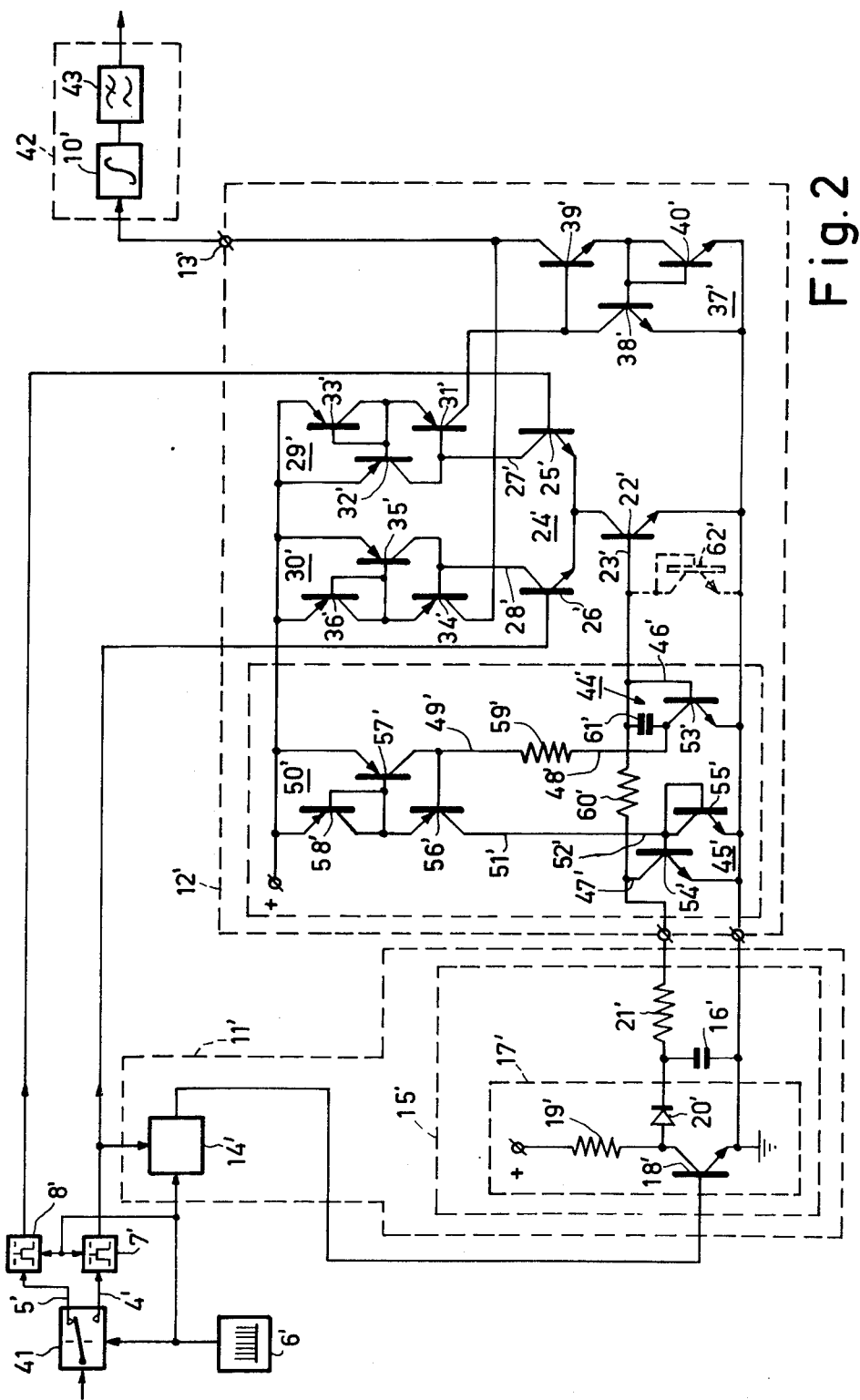

FIG. 2 shows a receiver which is adapted for the reception of the 1 and 0 pulses applied by the output amplifier 9 shown in FIG. 1 to the transmission path. In this receiver the construction largely corresponds to the transmitter shown in FIG. 1, elements corresponding to those in FIG. 1 being denoted by the same reference numerals as in FIG. 1 but these reference numerals for the elements relating to this receiver being provided with indices.

In the receiver shown in FIG. 2 the received pulses are applied to a switch 41 which is shown only symbolicaly and which is controlled by a clock pulse generator 6' synchronized on the clock pulse generator 6 of the transmitter. This switch 41 has two outputs 4' and 5' having pulse regenerators 7' and 8' connected thereto which fulfil the same function as the pulse regenerators 7 and 8 in the transmitter. More particularly, a pulse having a logical value of 1 is applied to the output 4' of the switch 41 if a received pulse of the logical value 1 is applied to the switch, while a pulse having a logical value of 0 is additionally applied to the output 5'. When, on the other hand, a received pulse applied to the switch has the logical value of 0, a pulse having the logical value of 0 is applied to the output 4' and a pulse having the logical value of 1 is applied to the output 5'. Thus the same pulse series as at the outputs of the pulse regenerators 7 and 8 in the transmitter are produced at the outputs of the pulse regenerator 7' and 8'.

The output pulses from the pulse regenerator 7' are applied to a dynamic control circuit 11' which likewise includes a pulse pattern analyser 14' and an integrating network 15' with a controlled current source circuit 17' and an integrating capacitor 16'. Also, in this receiver, the output current from the dynamic control circuit 11' is applied to a modulator 12' which is identical to and is operable in the same manner as the modulator 12 in the transmitter. The output 13' of the modulator 12' is connected to the input of a decoder 42 which is constituted in this embodiment by a series arrangement of an integrating network 10' and a low passfilter 43.

In the arrangement described hereinbefore, serious deviations in the desired linearity of the signal transmission occur because transistors of the npn-type are used in the modulators 12 and 12' in combination with transistors of the pnp-type and more particularly because the pnp-transistors generally have a too low current gain factor so that the current gain factor p of the pnp current mirror circuits 29 and 30 already denoted in FIG. 1 is considerably less than one, whereas the current gain factor of the npn current mirror circuits 37 and 37' is accurately equal to one and thus the input current is accurately equal in value to the output current in these npn current mirror circuits.

These deviations in the linearity of the signal transmission occur particularly if the modulators 12 and 12' are formed as monolithic integrated circuits; in fact, in such integrated circuits the temperature and current-dependent current gain factor of the pnp transistors may differ from integrated circuit to integrated circuit.

In a transmission device of the type described hereinbefore using monolithic integrated modulators 132 and 12' it is the object of the invention to obviate the above-mentioned deviations in the linearity ot a considerable extent.

According to the invention the modulators 12 and 12' of the transmitter and receiver include respective controlled fourth current source circuits 44 and 44' and a controlled fifth current source circuits 45 and 45'. The control inputs 46 and 46' of the fourth current source circuits 44 and 44' and the outputs 47 and 47' of the fifth current source circuits 45 and 45' are coupled to the inputs of the modulators 12 and 12' respectively, the outputs 48 and 48' of said fourth current source circuits 44 and 44' being connected to the control inputs 49 and 49' of current-controlled sixth current source circuits 50 and 50', respectively, the outputs 51 and 51' of said latter circuits being connected in the manner of a feedback to the control inputs 52 and 52' of the fifth current source circuits 45 and 45' respectively.

In the embodiment shown the fourth current source circuits 44 and 44' are constituted by npn-transistor 53 and 53' respectively, arranged in parallel with the transistors 22 and 22'. The fifth current source circuits 45 and 45' are again constituted by current mirror circuits and are each built up in known manner of npn-transistors 54 and 54' are npn-transistors 55 and 55' arranged as diodes. Of these transistors 53, 53', 54, 54' and 55, 55' the emitters are connected to ground potential. The sixth current source circuits 50 and 50' are likewise constituted as current mirror circuits and are built up in the same manner as the current mirror circuits 29, 30 and 29', 30' in the modulators 12 and 12', respectively. These current mirror circuits 50 and 50' each likewise include two pnp-transistors 56 and 57 and 56' and 57' and pnp-transistors 56 and 57 and 56' and 57' and pnp-transistors 58 and 58' arranged as diodes. The emitters of the transistors 57, 58 and 57'and 58' are connected to the positive terminal of the direct voltage supply source, the interconnected collectors and bases of the transistors 57, 56 and 57' and 56' are coupled to the collectors of the transistors 53 and 53', while the collectors of the transistors 56 and 56' are connected to the control inputs 52 and 52' of the fifth current source circuits 45 and 45' respectively. Since these current mirror circuits 50 and 50' are built up in the same manner as the other current mirror circuits built up with pnp-transistors of the modulators 12 and 12' the current gain factor is equal to p also for these current mirror circuits 50 and 50'.

The operation of the modulators 132 and 12' in the transmitter and receiver is completely equal due to their identical structure. It will therefore be sufficient hereinafter to give a description of the operation of the modulator 12 shown in the transmitter of FIG. 1.

When a current $I_{in}$ is applied by the dynamic control circuit 11 to the modulator 12, equal currents $I_1$ will flow in the collector circuits of the parallel-arranged transistors 22 and 53 in a direction denoted by the solid-line arrows. When the transistor 26 of the difference amplifier 24 conduts, a charge current having the value of $pI_1$ flows in the collector circuit of the transistor 34. When the transistor 25 of the difference amplifier 24 conducts, a discharge current having the value of $pI_1$ flows in the collector circuit of the transistor 39. Independent of whether transistor 25 or transistor 26 is conducting, a current having the value of $pI_1$ likewise flows in the collector circuit of transistor 56 in the current mirror circuit 50. This current is applied as a control current to the current mirror circuit 45 which is built up of npn-transistors and therefore has a current gain factor which is very accurately equal to one. Consequently, a current having the value of $pI_1$ flows in the collector circuit of transistor 54. Since the base currents of the transistors 22 and 53 are negligibly small relative to the current $pI_1$, the current $pI_1$ is accurately equal to the current $I_{in}$.

By using the steps according to the invention it is thus achieved that the value of the charge and discharge currents of the integrating network 10 are independent of the value of the current gain factors of the pnp-transistors used. More particularly in the embodiment shown the value of a charge or discharge current is equal to the input current of the modulator 12.

In the transmitter and receiver shown in FIGS. 1 and 2, respectively, the collector circuits of the transistors 53 and 53' incorporate the resistors 59 and 59', the base circuits of the transistors 22 and 22' incorporate the resistors 60 and 60' and the collector circuits of the transistors 53 and 53' are connected through capacitors 61 and 61' to the base electrodes of the transistors 22 and 22', respectively. The RC networks constituted by these resistors and capacitors are used for suppressing parasitic oscillations which may occur in the feedback circuit constituted by the current source 44, 44' and the current mirror circuits 45, 45' and 50, 50'.

GENERAL REMARKS

Without affecting the satisfactory operation of the embodiment described hereinbefore the bases of the transistors 25 and 25' of the difference amplifier 24 and 24' may be connected for example to a fixed reference voltage. In such a concept the output 5 of the quantising circuit 3 and the pulse regenerator 8 may be omitted in the transmitter and the output 5' of the switch 41 and the pulse regenerator 8' may be omitted in the receiver.

As regards the integrating networks 10 and 10' it is to be noted that these networks may be formed both for single and double integration. Integrating network 10 of the transmitter may be alternatively incorporated between the output of the comparison circuit 2 and the input of the quantising circuit 3. In this manner the so-called delta-sigma modulator is obtained. In this embodiment of the transmitter the integrating network 10' used in the receiver may be omitted.

In the foregoing monolithic integration of the modulators 12 and 12' has been referred to. Dependent on the selected integration technique the modulator together with, for example, the dynamic control circuit and other elements may be integrated in a monolithic manner. More particularly it is to be noted that in the integrated circuits the transistors 22 and 53 and 22' and 53' may be combined into one transistor having two collector circuits.

It is also to be noted that the current mirror circuits 45 and 45' used in the embodiment described may be formed in the same manner as the current mirror circuits 37 and 37'. In addition, the current mirror circuits 29, 30, 37, 50 and 29', 30', 37', 50' may each be built up in known manner with a comparatively large or a comparatively small number of transistors.

What is claimed is:

1. An arrangement for the transmission of information signals by pulse code modulation comprising a receiver; and a transmitter, the transmitter comprising an input terminal for receiving said information signals to be transmitted, a comparison circuit having a first input connected to said input terminal, a quantizing device connected to an output of said comparison circuit, a pulse generator connected to an output of said quantizing device and providing output pulses to said receiver, a dynamic control circuit connected to an output of said pulse generator and providing a dynamic control signal, a modulator having an input receiving said dynamic control signal, a decoder connected to an output of said modulator and having an output connected in a feedback path to the second input of said comparison circuit, a difference amplifier in said modulator, a first controlled current source in said modulator providing current to said difference amplifier, said pulse generator being coupled to first and second inputs of said difference amplifier and alternately providing pulse signals thereto, a second controlled current source circuit in said modulator having a control input connected to a first output of said difference amplifier and an output connected to the output of said modulator, a third controlled current source circuit in said modulator substantially identical to said second controlled current source and having a control input connected to a second output of said difference amplifier, a precision polarity reversing circuit in said modulator connecting an output of said third controlled current source to said modulator output, a fourth controlled current source in said modulator having a control input connected to the input of said modulator, a fifth controlled current source in said modulator having an output connected to the input of said modulator and to a control input of the first controlled current source, and a sixth controlled current source in said modulator having a control input connected to an output of said fouth controlled current source and having an output connected in a feedback path to a control input of the fifth controlled current source.

2. A transmitter for transmitting information signals by pulse code modulation, comprising an input terminal for receiving information signals to be transmitted, a comparison circuit having a first input connected to said input terminal, a quantizing device connected to an output of said comparison circuit, an output terminal for said transmitter, a pulse gernator connected to an output of said quantizing device and providing output pulses to the output terminal of said transmitter, a dynamic control circuit connected to an output of said pulse generator and providing a dynamic control signal, a modulator having an input receiving said dynamic control signal, and decoder connected to an output of said modulator and having an output connected in a feedback path to a second input of said comparison circuit, a difference amplifier in said modulator, a first controlled current source in said modulator providing current to said difference amplifier, said pulse generator being connected to first and second inputs of said difference amplifier and alternately providing pulses thereto, a second controlled current source circuit in said modulator having a control input connected to a first output of said difference amplifier and an output connected to the output of said modulator, a third controlled current source circuit in said modulator substantially identical to said second controlled current source circuit and having a control input connected to a second output of said difference amplifier, a precision polarity reversing circuit in said modulator connecting an output of said third controlled current source to said modulator output, a fourth controlled current source in said modulator having a control input connected to the input of said modulator, a fifth controlled current source in said modulator having an output connected to the input of the modulator and to a control input of the first controlled current source circuit, and a sixth controlled current source circuit in said modulator having a control input connected to an output of said fourth controlled current source circuit and having an output connected in a feedback path to a control input of the fifth controlled current source.

3. A transmitter as recited in claim 2, wherein said fifth current source circuit comprises a current mirror circuit consisting of transistors of the npn-type.

4. A transmitter as claimed in claim 2, wherein all of said controlled current source circuits are constituted by current mirror circuits consisting of transistors of the pnp-type.

5. A transmitter as recited in claim 2, wherein said sixth controlled current source circuit is identical to the second and third controlled current source circuits.

6. A transmitter as recited in claim 5, wherein all of said controlled current source circuits comprise current mirror circuits consisting of transistors of the pnp-type.

7. A receiver for receiving information signals transmitted in the form of pulse code modulation, comprising an input terminal for receiving information signals in the form of pulse code modulation, a quantizing device connected to said input terminal, a pulse generator connected to an output of said quantizing device and providing output pulses, a dynamic control circuit connected to an output of said pulse generator and providing a dynamic control signal, a modulator having an input receiving said dynamic control signal, a decoder connected to an output of said modulator for converting said pulse code modulation into information signals, a difference amplifier in said modulator, a first controlled current source circuit in said modulator providing current to said difference amplifier, said pulse generator being connected to first and second inputs of said difference amplifier, a second controlled current source circuit in said modulator having a control input connected to a first output of said difference amplifier and an output connected to the output of said modulator, a third controlled current source circuit in said modulator and substantially identical to said second controlled current source circuit and having a control input connected to a second output of said difference amplifier, a precision polarity reversing circuit in said modulator connecting an output of said third controlled current source circuit to said modulator output, a fourth controlled current source circuit in said modulator having a control input connected to the input of said modulator, a fifth controlled current source circuit in said modulator having an output connected to the input of the modulator and to a control input of the first controlled current source, and a sixth controlled current source circuit in said modulator having a control input connected to an output of said fourth controlled current source circuit and having an output connected in a feedback path to a control input of the fifth controlled current source circuit.

8. A receiver as recited in claim 7, wherein all of said controlled current source circuits are constituted by current mirror circuits composed of transistors of the pnp-type.

9. A receiver as recited in claim 7, wherein said fifth controlled current source circuit is constituted by a current mirror circuit composed of transistors of the npn-type.

10. A receiver as recited in claim 7, wherein said sixth controlled current source circuit is substantially identical to the second and third controlled current source circuits.

11. A receiver as recited in claim 10, wherein all of said controlled current source circuits are constituted by current mirror circuits composed of transistors of the pnp-type.

* * * * *

UNITED STATES PATENT AND TRADEMARK OFFICE
CERTIFICATE OF CORRECTION

PATENT NO. : 4,039,950

DATED : August 2, 1977

INVENTOR(S) : JOHANNES WILHELMUS GLASBERGEN

It is certified that error appears in the above-identified patent and that said Letters Patent are hereby corrected as shown below:

Col. 6, line 15, "132" should be --12--;

line 17, "ot" should be --to--;

line 40, after "54" "are" should be --and--;

line 64, "132" should be --12--.

Signed and Sealed this

Twenty-second Day of November 1977

[SEAL]

Attest:

RUTH C. MASON
Attesting Officer

LUTRELLE F. PARKER
Acting Commissioner of Patents and Trademarks